United States Patent
Fossum et al.

(10) Patent No.: US 6,646,583 B1
(45) Date of Patent: Nov. 11, 2003

(54) HIGH SPEED DIGITAL TO ANALOG CONVERTER USING MULTIPLE STAGGERED SUCCESSIVE APPROXIMATION CELLS

(75) Inventors: Eric R. Fossum, La Crescenta, CA (US); Sandor L. Barna, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/061,938

(22) Filed: Oct. 25, 2001

Related U.S. Application Data

(60) Provisional application No. 60/243,324, filed on Oct. 25, 2000.

(51) Int. Cl.[7] .............................................. H03M 1/66
(52) U.S. Cl. ...................... 341/144; 341/155; 341/143; 341/120
(58) Field of Search ................................ 341/155, 120, 341/144, 143

(56) References Cited

U.S. PATENT DOCUMENTS

| | | | | |
|---|---|---|---|---|
| 5,801,657 A | * | 9/1998 | Fowler et al. | 341/155 |
| 5,880,691 A | * | 3/1999 | Fossum et al. | 341/162 |
| 5,886,659 A | * | 3/1999 | Pain et al. | 341/155 |
| 5,920,274 A | * | 7/1999 | Gowda et al. | 341/155 |
| 6,124,819 A | * | 9/2000 | Zhou et al. | 341/155 |
| 6,377,303 B2 | * | 4/2002 | O'Connor | 348/308 |

* cited by examiner

*Primary Examiner*—Michael Tokar
*Assistant Examiner*—Lam T. Mai
(74) *Attorney, Agent, or Firm*—Dickstein Shapiro Morin & Oshinsky LLP

(57) ABSTRACT

An image sensor system using offset analog to digital converters. The analog to digital converters require a plurality of clock cycles to carry out the actual conversion. These conversions are offset in time from one another, so that at each clock cycle, new data is available.

24 Claims, 4 Drawing Sheets

HIGH SPEED DIGITAL TO ANALOG CONVERTER USING MULTIPLE STAGGERED SUCCESSIVE APPROXIMATION CELLS

CROSS-REFERENCE TO RELATED APPLICATIONS

This application claims priority from provisional application No. 60/243,324 filed Oct. 25, 2000.

BACKGROUND

The basic operation of a CMOS active pixel sensor is described in U.S. Pat. No. 5,471,215. This kind of image sensor, and other similar image sensors, often operate by using an array of photoreceptors to convert light forming an image, into signals indicative of the light, e.g. charge based signals. Those signals are often analog, and may be converted to digital by an A/D converter. Image sensors which have greater numbers of elements in the image sensor array may produce more signals. In order to handle these signals, either more A/D converters must be provided, or the existing A/D converters need to digitize the data from these image sensors at higher signal rates. For example, a high precision CMOS active pixel sensor may require an A/D converter which is capable of 10 bits of resolution at 20 Megasamples per second.

Image sensors of this type are often limited by the available area or "real estate" on the chip, a and the available power for driving the chip. An advantage of using CMOS circuitry is that power consumption of such a circuit may be minimized. Therefore, the power consumption of such a circuit remains an important criteria. Also, since real estate on the chip may be limited, the number of A/D converters and their size should be minimized.

A/D converters with this kind of resolution, in the prior art, may have a power consumption of about 25 mW using a 3.3 volt power supply.

SUMMARY

The present application describes a system, and a special A/D converter using individual successive approximation A/D converter cells which operate in a pipelined fashion.

BRIEF DESCRIPTION OF THE DRAWINGS

These and other aspects will now be described in detail with reference to the accompanying drawings, wherein.

DETAILED DESCRIPTION

According to the present system, a plurality of successive approximation A/D converter cells are provided. The embodiment recognizes that the pixel analog data is arriving at a relatively high rate, e.g. 20 Mhz. A plurality of A/D converters are provided, here twelve A/D converters are provided, each running at 1.6 megasamples per second. The timing of these A/D converters are staggered so that each A/D converter is ready for its pixel analog input at precisely the right time. The power consumption of such cells is relatively low; and therefore the power may be reduced.

In the embodiment, an A/D converter with 10 bits of resolution and 20 megasamples per second is provided that has a power consumption on the order of 1 mW. Twelve individual successive approximation A/D converter cells are provided. Each requires 600 ns to make each conversion. Since twelve stages are necessary, the total data throughput equals twelve/600 ns=20 megasamples per second. Each successive approximation A/D converter requires 12 complete clock cycles to convert the 10 bit data. The first clock cycle samples the input data, then 10 clock cycles are used to convert each of the bits. A single clock cycle is used for data readout.

Figure 1:
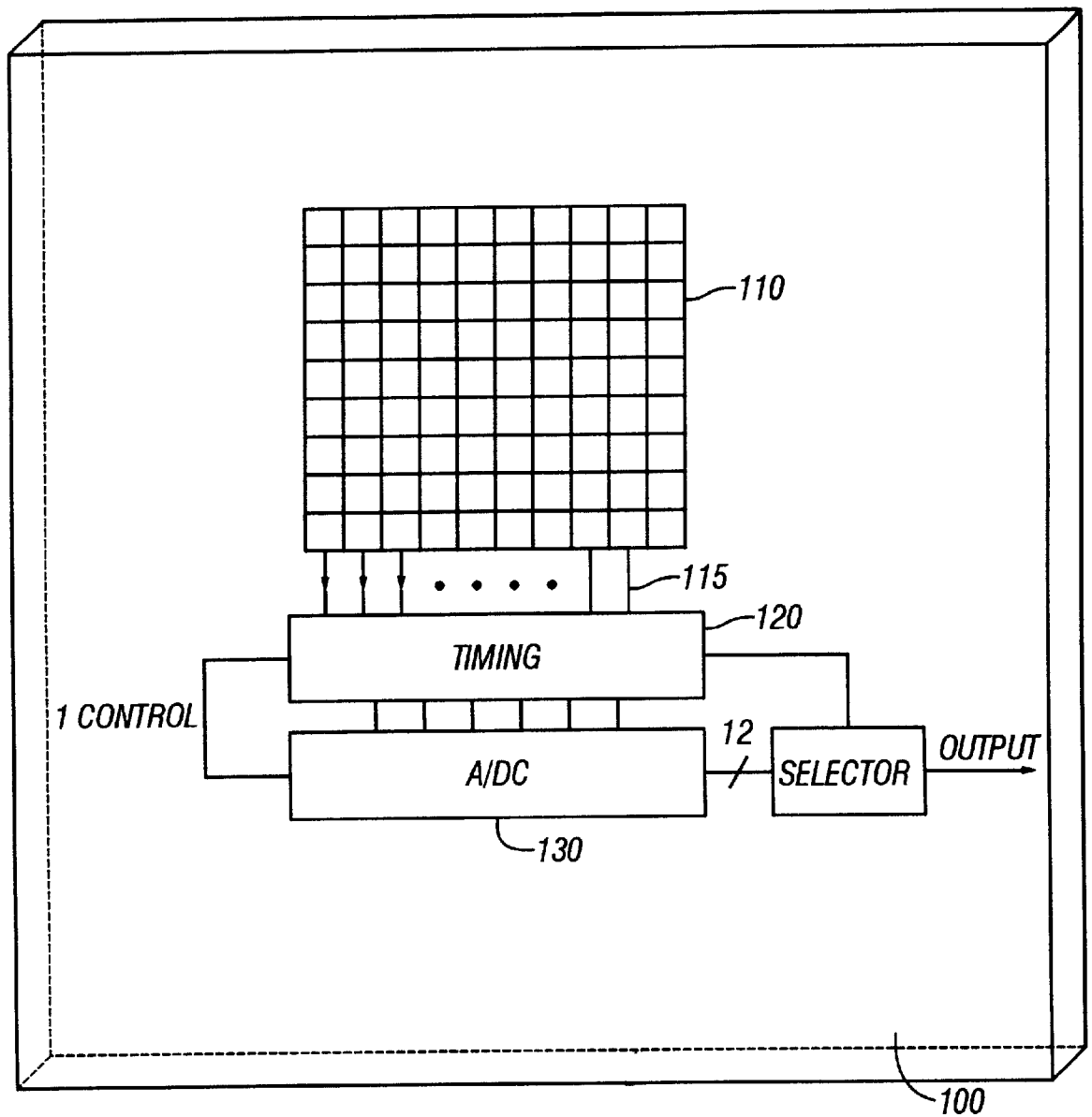
FIG. 1 shows a block diagram of a circuit on a chip including an image sensor and A/D converter.

A block diagram is shown in FIG. 1. FIG. 1 shows how a single chip substrate 100 includes a photo sensor array 110. Photosensor array 110 can be an array of, for example, photodiodes, photogates, or any other type of photoreceptors. The output 115 of the array 110 is coupled to a timing circuit 120 which arranges the data to be sent to the A/D converter array 130. The data is sent such that each A/D converter receives data at a different, staggered time.

Figure 2:
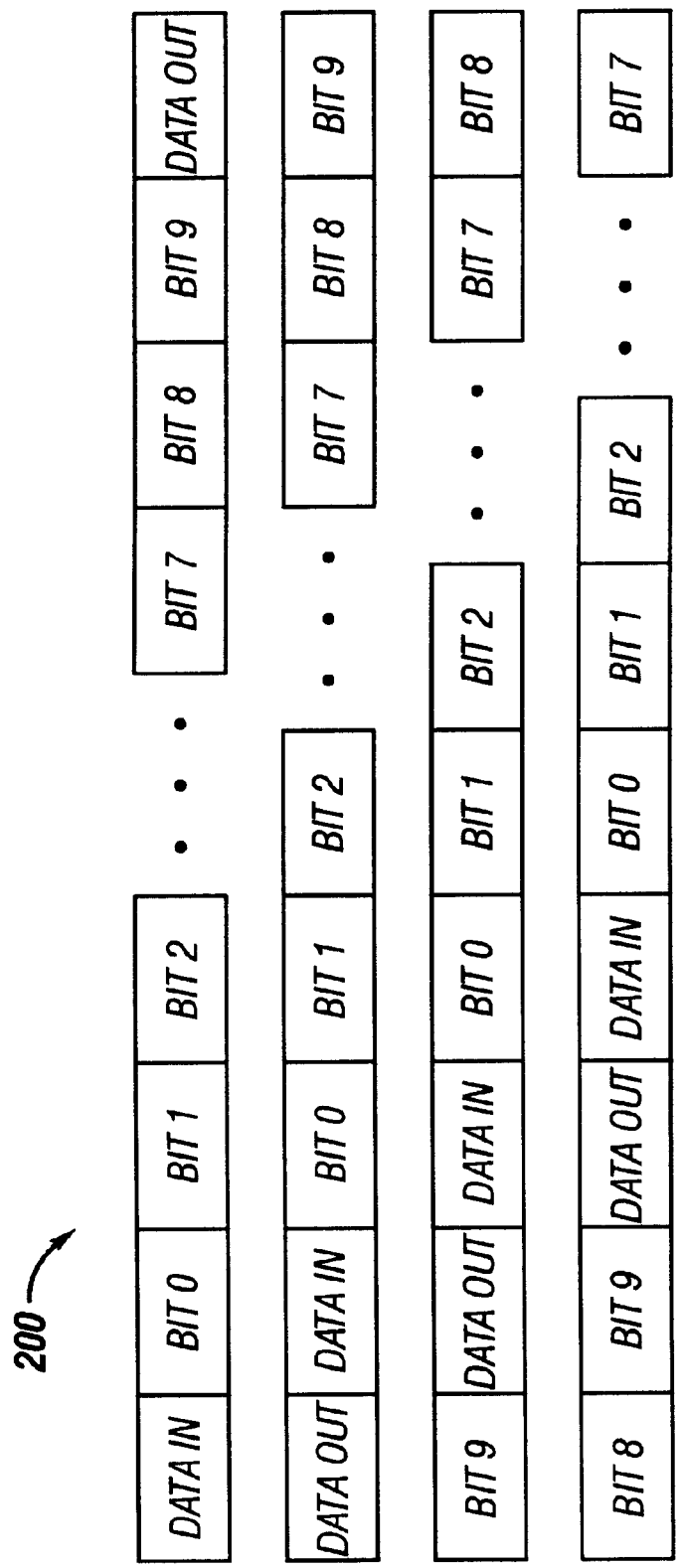
FIG. 2 shows relative timing of A/D converter cells.

FIG. 2 shows how the timing and switching of the data is carried out. The input signals from the image sensor array 110 are staggered and provided to the A/D converters at different times, preferably one clock cycle apart. FIG. 2 shows the relative timing of four of the twelve A/D converter cells. The first row 200 for example may represent the first A/D converter. Data that is input during cycle No. 1 is available at the output of the A/D converter during cycle No. 12. Different data from different ones of the converters are output in each cycle.

Figure 3:
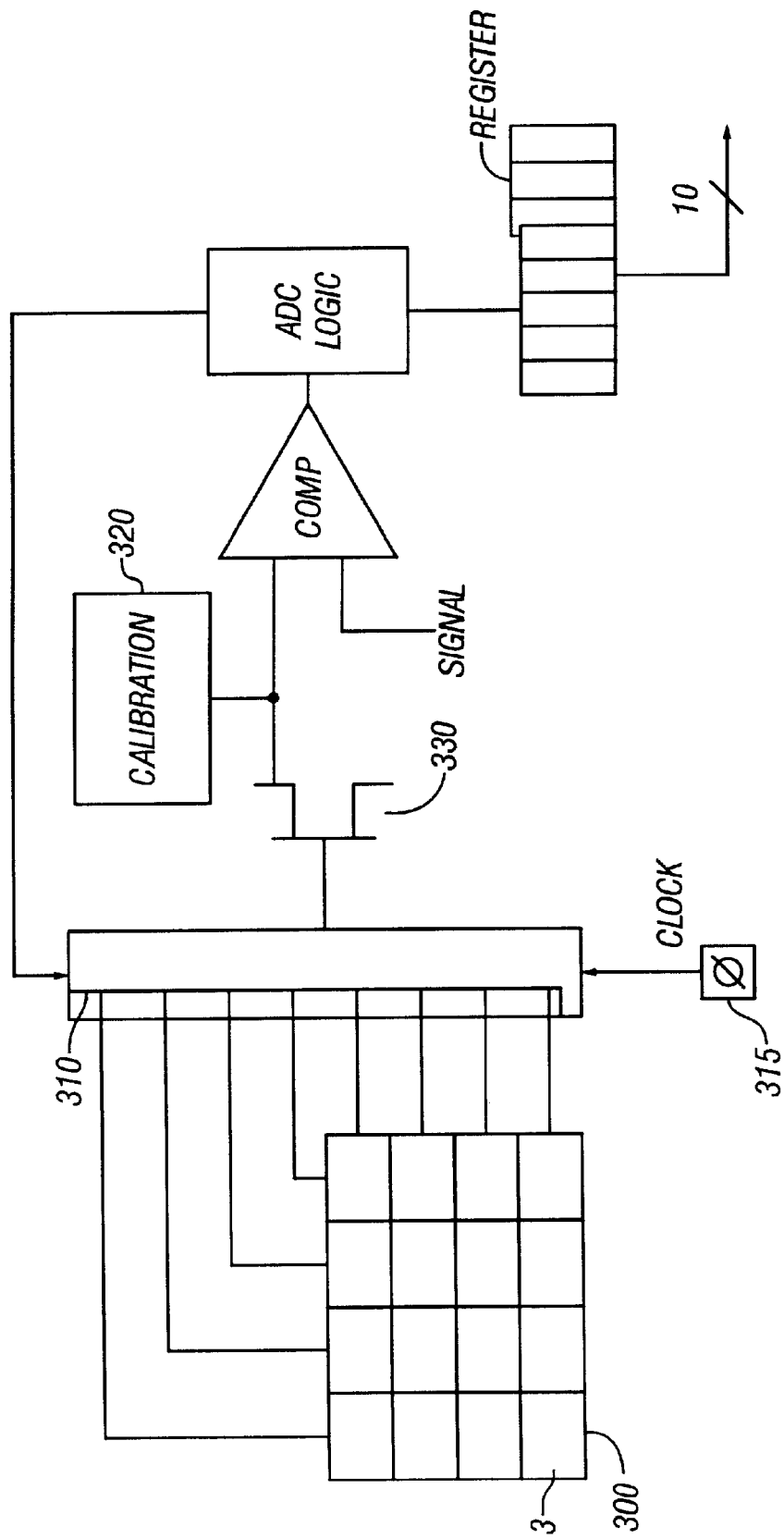
FIG. 3 shows an embodiment with built-in calibration in the system.

FIG. 3 shows a block diagram of each of the twelve A/D converter elements. The elements may operate using capacitors formed by a capacitor array 300. In this embodiment, unit cell capacitors are formed. The capacitor array 300 is formed, for example, of N different elements, each of which are identical. Matching each of these capacitors may ensure linearity. A switching element 310 may switch the capacitor combinations in the proper way to convert a specific bit. As conventional in a successive approximation A/D converter, different bits are obtained and output during different clock cycles. Hence the clock input at 315 may select the different bits which are used and may hence select the number of the capacitor elements which are used.

This system may adaptively assign the channels to A/D converters in a different way than conventional. Conventional methods of removing fixed patterned noise, therefore, might not be as effective. Therefore, it becomes important that these A/D converters have consistent characteristics. In this embodiment, calibration may be used to compensate for offsets between the comparators of the system.

Successive approximation A/D converters as used herein may have built-in calibration shown as elements 320. Any type of internal calibration system may be used.

The inventors also realize that comparator kickback noise may become a problem within this system. That comparator itself may produce noise which may affect the signal being processed. In this embodiment, a single preamplifier, here shown as a follower 330, is introduced between the signal and the comparator.

This system also requires generation of multiple timing and control signals to maintain the synchronization. Each successive approximation A/D converter requires about 20 control signals. The timing is offset for each of the twelve different A/D converters. Therefore, digital logic is used to replicate control signals after a delay.

Figure 4A:
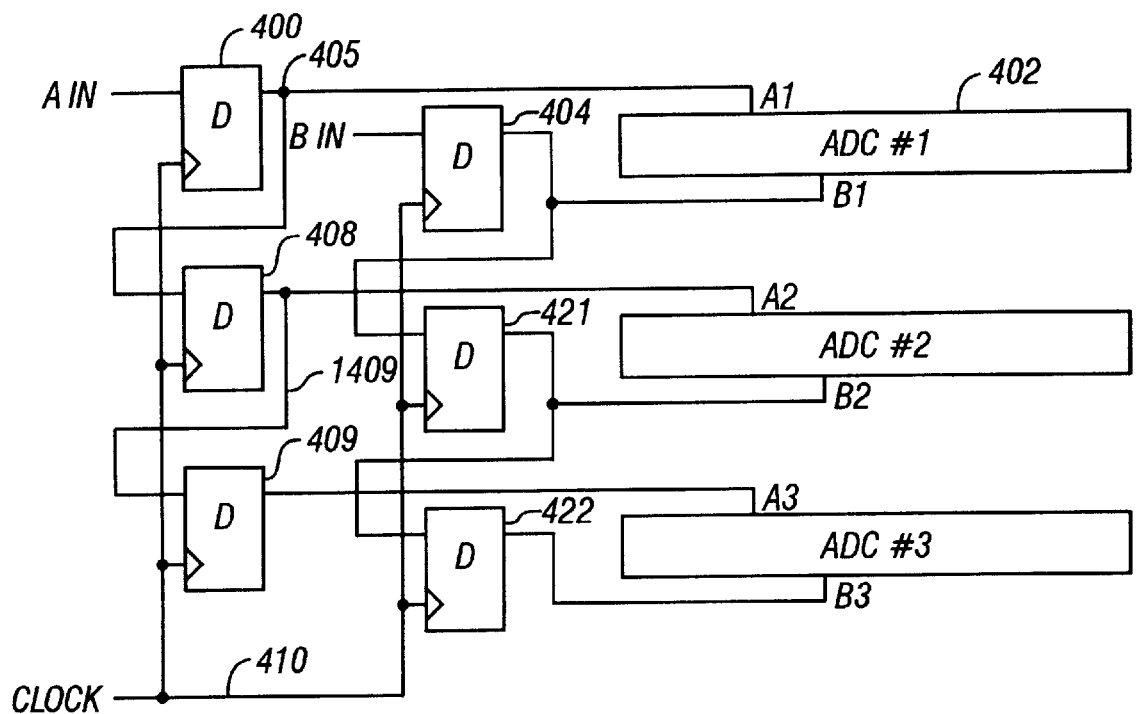
FIGS. 4A and 4B show two alternative schemes for implementing the A/D converter timing and control.

In one embodiment, shown in FIG. 4A, a plurality of flip-flops, here D type flip-flops, are used to delay the respective signals. In FIG. 4A, the control signals showed as A in and B in are separately delayed using a series of flip-flops; with A in delayed by flip-flops 400, 408, 409; and B in delayed by flip-flops 404, 421, 422. For example, the control signal A in is delayed by flip-flop 400 to produce signal A1, line 405, which is the first control signal for the first A/D converter 402. Similarly, the B in control signal is delayed by flip-flop 404 to produce the B1 control signal for the A/D converter 402. The A1 signal 405 also drives the input of the second D flip-flop 408. The output of flip-flop 408 similarly drives flip-flop 409 and the like. Each successive output such as 405 is then delayed by the next flip-flop 408, and used as the respective second control (here A2, B2) for the A/D converters.

Each cycle of the A/D converter may require finer timing than can be offered by a usual clock. Hence, the clock input 410 may be a divided higher speed clock.

Two D type flip-flops are required to delay each signal. Any signal which is only half a clock cycle in length may require falling edge flip-flops, in addition to the rising edge flip-flops, and may also require additional logic.

Figure 4B:
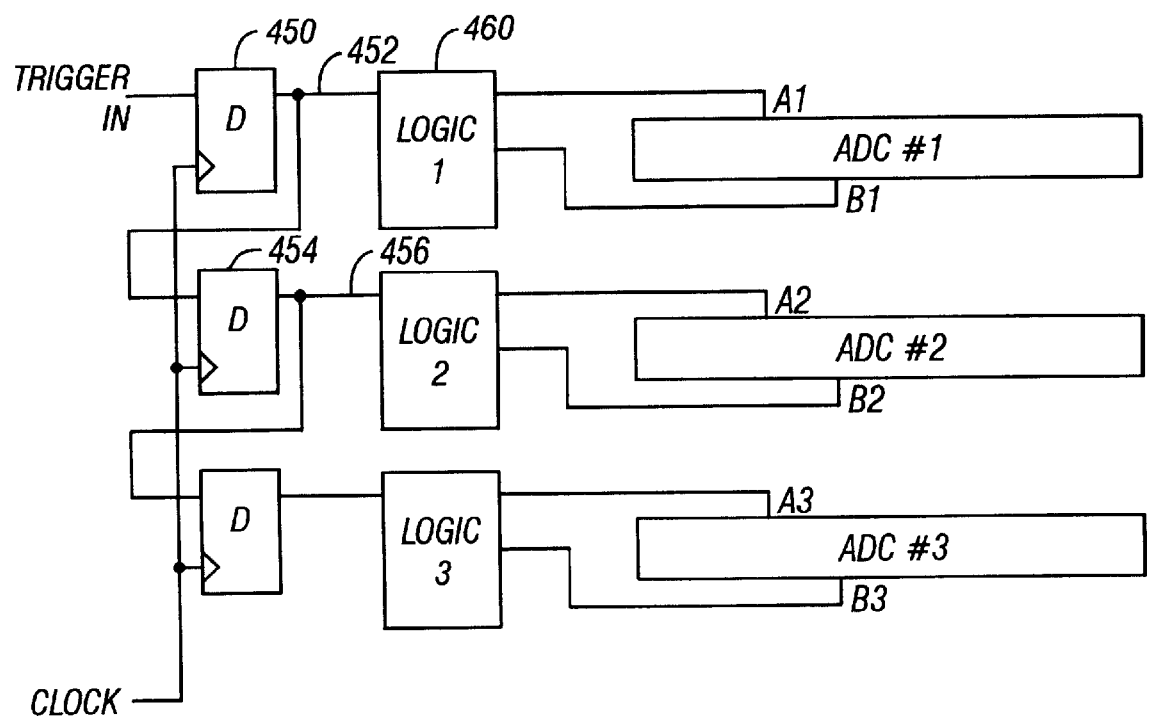

FIG. 4B shows an A/D converter cell with a trigger signal that is staggered by one or two flip-flops according to the master clocks. All of the local control signals may be generated locally within the A/D converter. Delayed versions of the clock are still obtained. For example, the D. type flip-flops 450 produces a delayed version 452. Delayed version 452 triggers the next the flip-flop 454 to produce delayed version 456. Each of the delayed versions, such as 452, is further processed by the logic block 460. Logic block for 60 outputs the two control signals A1 and B1. For example, the control signal A1 may be output directly, with control signal B1 being delayed by a series of logic gates or transistors. Since this system uses fewer flip-flops, and only a single input signal, it may allow for improved symmetry between the A/D converters.

Although only a few embodiments have been disclosed in detail above, other modifications are possible. For example, different logic techniques may be used herein. In addition, while the above describes specific numbers of bits, the same techniques are applicable to other numbers of elements. For example, this system may be used with as few as three elements, with the three successive approximation devices staggered to receive one out of every three inputs.

The above has described matched unit cell capacitors, but it should also be understood that other capacitors could be used. Conventional capacitors which are not matched in this way can be used. In addition, the capacitors can be scaled relative to one another by some amount, e.g. in powers of two.

All such modifications are intended to be encompassed within the following claims.

What is claimed is:

1. An analog to digital converter, comprising:
    a plurality n of successive approximation type A/D converters, where there are at least three of said successive approximation A/D converters, arranged to receive image information in an analog form, and each of said n successive approximation type A/D converters outputting digital information at different times which are offset from one another.

2. A converter as in claim 1, wherein each A/D converter requires a plurality of clock cycles to make a single A/D conversion.

3. A converter as in claim 1, wherein each A/D converter requires n clock cycles, and wherein there are n of said A/D converters, and said offset between A/D converters is one clock cycle.

4. A converter as in claim 3 wherein n equals 12.

5. A converter as in claim 3, wherein said plurality of successive approximation A/D converters are each formed from a plurality of unit capacitors forming a total capacitance to be used by said converter.

6. A converter as in claim 5, wherein each of said A/D converters includes a comparator, and further comprising an amplifier element located between said capacitors and said comparator.

7. A converter as in claim 1, wherein each of said successive approximation A/D converters includes a plurality of capacitors, arranged to provide values indicative of different numbers of bits, a comparator, and a buffering element coupled between said capacitors and said comparator.

8. A converter as in claim 1, wherein each of said successive approximation A/D converters includes a plurality of capacitors, arranged to provide values indicative of different bits, and a comparator which compares outputs from said capacitors with a signal value.

9. A converter as in claim 7, further comprising a calibration element, coupled to an output of said buffer and an input of said comparator.

10. A converter as in claim 5, further comprising a logic element which selects a number of said unit capacitors based on a current bit being processed.

11. A converter as in claim 10, wherein said logic element receives a system clock, and is toggled between each state and the next state by said system clock.

12. A converter as in claim 1, further comprising a logic signal producing element, which produces logic signals to cause said n successive approximation A/D converters to output said digital information at said different times.

13. A converter as in claim 12, wherein said logic signal producing elements includes a plurality of flip-flops which are driven by a system clock.

14. A method, comprising:
    receiving pixel analog data from a plurality of image sensor elements; and
    converting said pixel analog data to digital in a way that takes multiple clock cycles, and in a way that staggers the output timing such that pixel data is available at each of a plurality of clock cycles.

15. A method as in claim 14, wherein said converting is such that pixel data is available at each and every clock cycle.

16. A method as in claim 15, wherein said converting takes N clock cycles to complete, and wherein there are N separate analog to digital converters, each operating staggered by one clock cycle.

17. A method as in claim 16, wherein said converting uses a comparator, and further comprising compensating for comparator kickback.

18. A method as in claim 17, wherein said compensating for comparator kickback comprises buffering between capacitors of an A/D converter, and comparators of an A/D converter.

19. A method as in claim 17, further comprising calibrating each of a plurality of individual A/D converters.

20. A method as in claim 17, wherein said converting comprises converting using successive approximation, according to values produced on a plurality of capacitors.

21. A method as in claim 20, wherein said converting comprises providing a plurality of unit capacitors, and switching different numbers of said unit capacitors depending on a stage of the bit.

22. A method, comprising:

receiving image data in a plurality of image sensor elements, which output analog data;

providing said analog data to a plurality of successive approximation type A/D converters which require a plurality of clock cycles to convert, said providing comprising providing different data to different A/D converters at different times, such that output digital values are available at staggered different times.

23. A method as in claim 22, wherein each A/D converter requires N cycles to make a conversion, and wherein there are N of said A/D converters offset in conversion by one clock cycle.

24. An image sensor system, comprising:

a semiconductor substrate;

an array of photoreceptors, arranged on said semiconductor substrate, and arranged to produce analog values indicative of received light energy in a plurality of pixels;

a plurality of successive approximation A/D converters, which require a plurality N of clock cycles to make each conversion, where there are at least N of said successive approximation A/D converters; and a timing element, providing said analog values to said successive approximation A/D converters in a staggered way, such that at each of a plurality of clock cycles, at least one successive approximation A/D converter produces a digital output.

\* \* \* \* \*